United States Patent
Nogami et al.

(10) Patent No.: US 9,966,286 B2
(45) Date of Patent: May 8, 2018

(54) SUBSTRATE PROCESSING APPARATUS

(71) Applicant: HITACHI KOKUSAI ELECTRIC INC., Tokyo (JP)

(72) Inventors: Takashi Nogami, Toyama (JP); Tomoshi Taniyama, Toyama (JP); Kazuma Yoshioka, Toyama (JP)

(73) Assignee: HITACHI KOKUSAI ELECTRIC INC., Tokyo (JP)

(*) Notice: Subject to any disclaimer, the term of this patent is extended or adjusted under 35 U.S.C. 154(b) by 0 days. days.

(21) Appl. No.: 15/263,478

(22) Filed: Sep. 13, 2016

(65) Prior Publication Data

US 2016/0379858 A1     Dec. 29, 2016

Related U.S. Application Data

(63) Continuation of application No. PCT/JP2015/058304, filed on Mar. 19, 2015.

(30) Foreign Application Priority Data

Mar. 20, 2014   (JP) .................................. 2014-058823

(51) Int. Cl.
    *H01L 21/67*     (2006.01)
    *H01L 21/677*    (2006.01)

(52) U.S. Cl.
    CPC .. *H01L 21/67265* (2013.01); *H01L 21/67766* (2013.01); *H01L 21/67769* (2013.01); *H01L 21/67772* (2013.01); *H01L 21/67775* (2013.01)

(58) Field of Classification Search
    CPC ......... H01L 21/67766; H01L 21/67769; H01L 21/67775

USPC .......................................................... 414/217
See application file for complete search history.

(56) References Cited

U.S. PATENT DOCUMENTS

| | | | | |
|---|---|---|---|---|
| 6,439,822 B1* | 8/2002 | Kimura | ............. | H01L 21/67769 118/719 |
| 7,134,826 B2* | 11/2006 | Mitsuyoshi | ....... | H01L 21/67769 414/217.1 |
| 7,409,263 B2* | 8/2008 | Elliott | ............... | H01L 21/67379 700/213 |
| 7,704,031 B2* | 4/2010 | Mitsuyoshi | ....... | H01L 21/67769 414/217 |
| 7,887,276 B2* | 2/2011 | Natume | .................. | B66F 11/00 414/217 |
| 8,128,333 B2* | 3/2012 | Aburatani | ......... | H01L 21/67766 414/217 |

(Continued)

FOREIGN PATENT DOCUMENTS

| | | |
|---|---|---|
| JP | 63-208430 A | 8/1988 |
| JP | 2004-296996 A | 10/2004 |

*Primary Examiner* — Kaitlin S Joerger
(74) *Attorney, Agent, or Firm* — Volpe and Koenig, P.C.

(57) ABSTRACT

A space needed to transfer a substrate container is decreased. A substrate processing apparatus includes a locating part where a substrate container accommodating a substrate is located; a driving unit configured to drive the locating part vertically; a transfer robot configured to transfer the substrate container; and a controller configured to control the driving unit and the transfer robot to move the locating part downward after the transfer robot moves to under the locating part to transfer the substrate container from the locating part to the transfer robot.

9 Claims, 12 Drawing Sheets

(56) References Cited

U.S. PATENT DOCUMENTS

| | | | | |
|---|---|---|---|---|
| 8,231,324 B2* | 7/2012 | Yoshida | ............... | B65G 1/0407 |
| | | | | 414/280 |
| 8,757,955 B2* | 6/2014 | Murata | .................. | B65G 37/02 |
| | | | | 212/71 |
| 8,814,488 B2* | 8/2014 | Aburatani | ......... | H01L 21/67769 |
| | | | | 414/217 |
| 8,814,490 B2* | 8/2014 | Inui | ................... | H01L 21/67769 |
| | | | | 414/279 |
| 2004/0191046 A1 | 9/2004 | Mitsuyoshi | | |
| 2016/0379858 A1* | 12/2016 | Nogami | ............ | H01L 21/67265 |
| | | | | 414/217.1 |

* cited by examiner

SUBSTRATE PROCESSING APPARATUS

CROSS-REFERENCE TO RELATED PATENT APPLICATION

This U.S. non-provisional Patent Application claims priority under 35 U.S.C. § 119 of Japanese Patent Application No. 2014-058823, filed on Mar. 20, 2014, in the Japanese Patent Office, and International Patent Application No. PCT/JP2015/058304, filed on Mar. 19, 2015, in the WIPO, the whole contents of which are hereby incorporated by reference.

BACKGROUND

1. Field

The present disclosure relates to a substrate processing apparatus for processing a substrate such as a semiconductor wafer.

2. Description of the Related Art

A substrate processing apparatus includes therein a substrate container shelf (a shelf) on which a substrate container such as a front opening unified pod (FOUP) is placed. The substrate container is transferred within the substrate processing apparatus by a transfer robot. The transfer robot includes an arm. The transfer robot moves the arm horizontally and then moves the arm downward to place a substrate container which is picked up by the arm on the substrate container shelf. Furthermore, the transfer robot lifts the substrate container from the substrate container shelf by moving the arm horizontally and then moving the arm upward from the bottom of the substrate container shelf.

As described above, in the substrate processing apparatus, when the substrate container is placed on or lifted from the substrate container shelf, a space in which the arm is positioned and a space for moving the arm upward or downward needs to be provided at the bottom of the substrate container shelf. Patent Document 1 discloses a substrate processing apparatus including multi-tier substrate container shelves, in which the multi-tier substrate container shelves are moved upward or downward to secure these spaces.

In order to increase the number of substrate container shelves to be accommodated in a limited space of the substrate processing apparatus (or the number of substrate containers to be accommodated in the substrate processing apparatus), a space needed to transfer and receive the substrate containers should be decreased.

RELATED ART REFERENCE

Patent Reference

Patent Document 1: Japanese Unexamined Patent Application Publication No. 2000-311935

SUMMARY

Described herein is a technique of decreasing a space needed for a transfer robot (which is configured to transfer a substrate container) to place the substrate container on a substrate container shelf or to lift the substrate container from the substrate container shelf.

Means to solve the above problem will be described below. According to one aspect, there is provided a technique of a substrate processing apparatus including a locating part where a substrate container accommodating a substrate is located; a driving unit configured to drive the locating part vertically; a transfer robot configured to transfer the substrate container; and a controller configured to control the driving unit and the transfer robot to move the locating part downward after the transfer robot moves to under the locating part to transfer the substrate container from the locating part to the transfer robot.

DETAILED DESCRIPTION OF THE PREFERRED EMBODIMENTS

First Embodiment

A substrate processing apparatus 100 according to a first embodiment described herein. will be described with reference to FIGS. 1 through 7 below. The substrate processing apparatus 100 according to the first embodiment includes a semiconductor manufacturing device which processes a substrate to manufacture a semiconductor device such as an integrated circuit (IC). In the following description, an example in which a substrate processing apparatus is a vertical apparatus (which may hereinafter be referred to simply as a "processing apparatus") which performs processing, such as oxidation, diffusion or chemical vapor deposition (CVD), on a substrate will be described.

Figure 1:
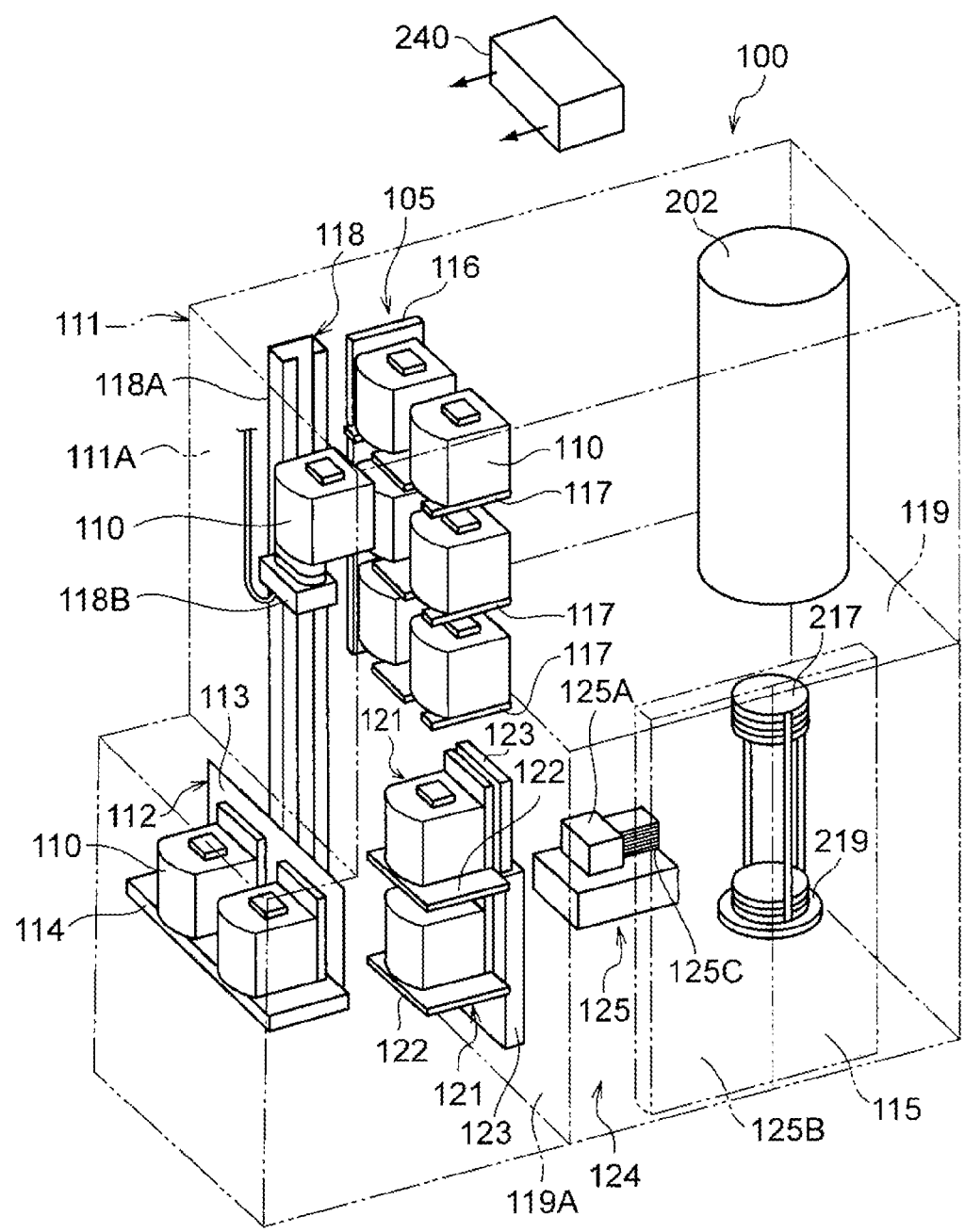
FIG. 1 is a perspective view of a substrate processing apparatus according to a first embodiment described herein.
Figure 2:
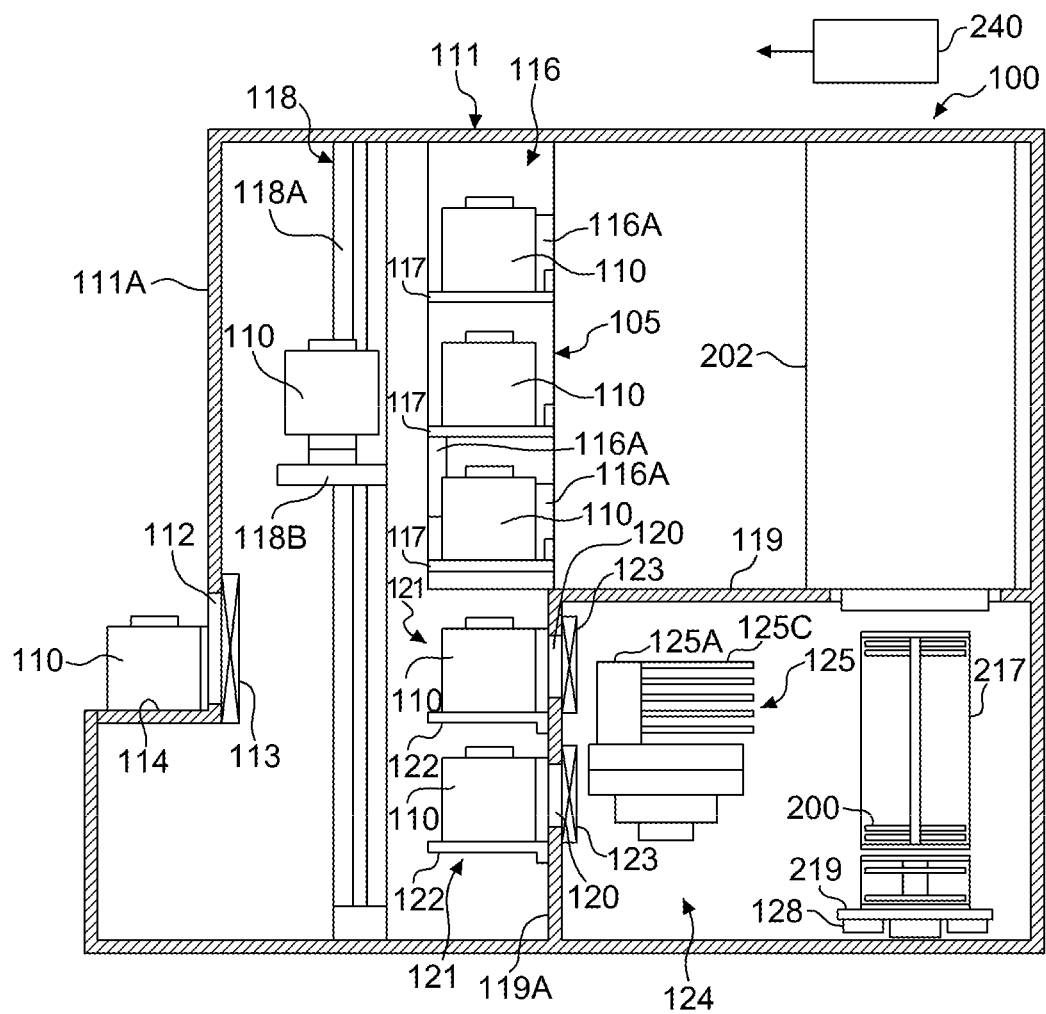
FIG. 2 is a perspective view of a side surface of the substrate processing apparatus according to the first embodiment described herein.

As illustrated in FIGS. 1 and 2, in the substrate processing apparatus 100 according to the first embodiment, a front opening unified pod (FOUP) 110 (hereinafter referred to as a "pod") which is a substrate container for accommodating a plurality of wafers 200 formed of a material such as silicon [substrates, see FIG. 2] is used as a wafer carrier.

The substrate processing apparatus 100 includes a housing 111. A pod loading/unloading port 112 is provided on a front wall 111A of the housing 111 to communicate the inside of the housing 111 with the outside of the housing 111. The pod loading/unloading port 112 may be opened or closed by a front shutter 113. A loading port 114 is installed in front of the pod loading/unloading port 112. The loading port 114 is configured to load/unload the pod 110.

A pod shelf 105 (a substrate container shelf) (a container shelf) is installed upward of a roughly central portion of the housing 111.

Figure 3:
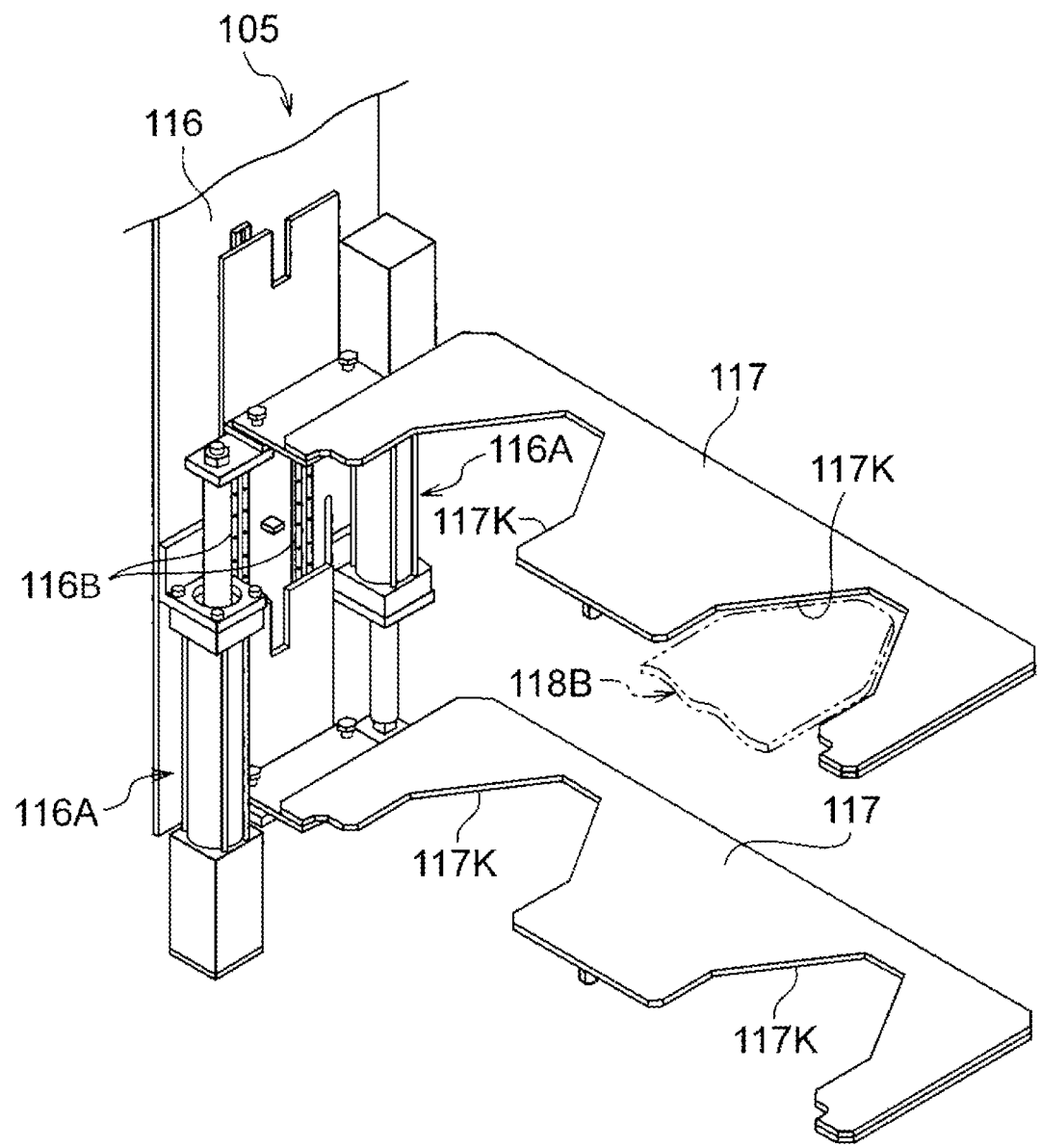
FIG. 3 is a perspective view of some elements of a substrate container shelf and a driving unit of the substrate processing apparatus according to the first embodiment described herein.
Figure 4:
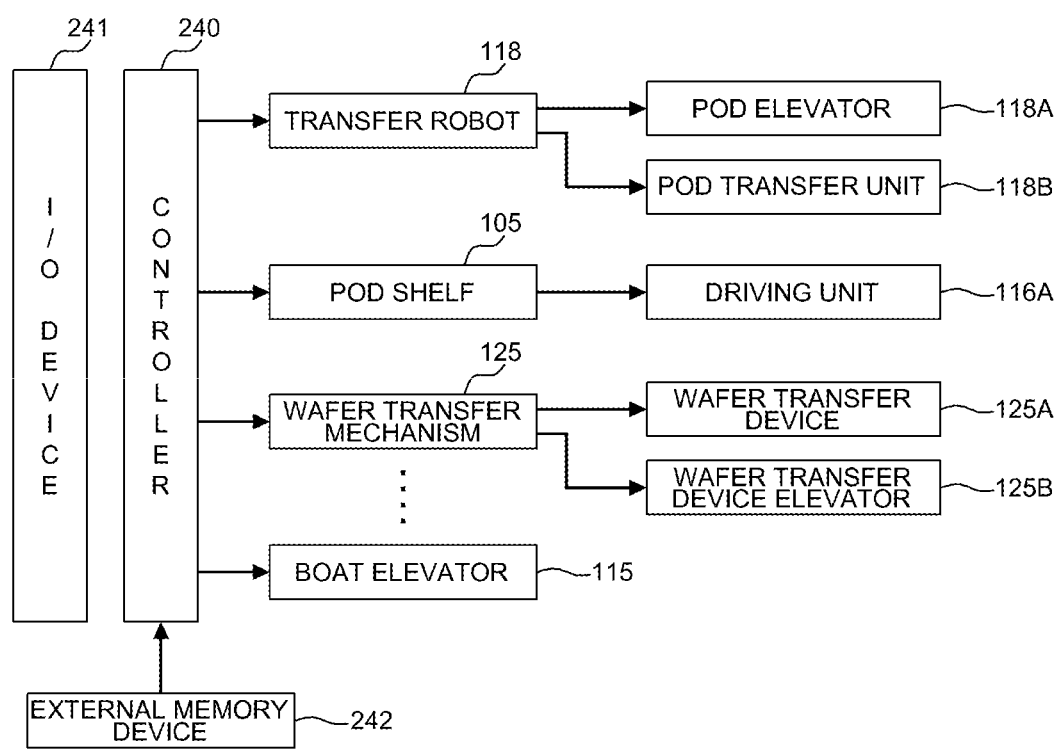
FIG. 4 is a block diagram of the substrate processing apparatus according to the first embodiment described herein.

As illustrated in FIGS. 1 through 3, the pod shelf 105 includes a support unit 116 installed vertically and a plurality of locating parts 117 (substrate container shelves) supported by the support unit 116. Although FIGS. 1 and 2 illustrate three substrate container shelves 117 and FIG. 3 illustrates two substrate container shelves 117, the number of the substrate container shelves 117 is not limited to two or three. The support unit 116 includes rails 116B installed vertically. One end of each of the substrate container shelves 117 is supported by the rails 116B. Each of the substrate container shelves 117 may be independently vertically moved along the rails 116B. Furthermore, a plurality of pods 110 may be located on the substrate container shelves 117. A notch 117K is provided at a location on which the pod 110 is placed. The notch 117K is open in a direction of a transfer robot 118 described below.

In the support unit 116, driving units 116A for vertically driving the substrate container shelves 117 are installed with respect to the substrate container shelves 117. The driving units 116A are respectively connected to the substrate container shelves 117. The driving units 116A may include a hydraulic cylinder (e.g., an air cylinder). The substrate container shelves 117 may be independently vertically moved along the rails 116B by independently driving the driving units 116A. As illustrated in FIG. 3, the driving units 116A adjacent in a vertical direction of the substrate container shelves 117 are vertically inverted with respect to each other (one of the driving units 116A is installed at each of left and right sides of each of the substrate container shelves 117 as illustrated in FIG. 3). Thus, a space needed to arrange the driving units 116A may be decreased.

The driving units 116A may include a structure such as a ball screw instead of a hydraulic cylinder.

As illustrated in FIGS. 1 and 2, the transfer robot (a robot arm) 118 is installed between the loading pod shelf 114 and the pod shelf 105 inside the housing 111. The transfer robot 118 includes a pod elevator 118A which is moved vertically and a pod transfer unit 118B for transferring the pods 110 in a horizontal direction. The pod transfer unit 118B is configured as a polyarticulated arm. A base end portion of the pod transfer unit 118B is connected to the pod elevator 118A. A front end portion of the pod transfer unit 118B may be moved to an arbitrary location on a horizontal plane according to a degree of freedom of the pod transfer unit 118B. When the pod transfer unit 118B transfers the pod 110, the pod 110 is placed on the front end portion of the pod transfer unit 118B. The transfer robot 118 transfers the pod 110 between the loading pod shelf 114, the pod shelf 105 [the substrate container shelves 117] and a pod opener 121 by operating the pod elevator 118A and the pod transfer unit 118B. For convenience of explanation, FIGS. 1 and 2 illustrate states in which the pods 110 are placed on all of the loading pod shelf 114, the substrate container shelves 117, the pod transfer unit 118B and the pod opener 121. However, any one of the loading pod shelf 114, the substrate container shelves 117, the pod transfer unit 118B and the pod opener 121 is actually empty to exchange the pods 110.

As illustrated in FIG. 3, the front end portion of the pod transfer unit 118B [a portion of the pod transfer unit 118B on which the pod 110 is placed] is configured to vertically pass through an inner side of the notch 117K. As illustrated in FIG. 3, when the substrate container shelves 117 are driven vertically, the upper substrate container shelf 117 and the pod transfer unit 118B do not interfere with each other. As the driving units 116A vertically drive the substrate container shelves 117 with respect to the pod transfer unit 118B, the pods 110 may be lifted from the substrate container shelves 117 or may be placed on the substrate container shelves 117.

As illustrated in FIGS. 1 and 2, a sub housing 119 is installed in the housing 111. Wafer loading/unloading ports 120 for loading the wafers 200 into or unloading the wafers 200 from the sub housing 119 are provided on a front wall 119A of the sub housing 119 in two tiers in the vertical direction. The pod opener 121 is installed at each of the wafer loading/unloading ports 120. The pod opener 121 includes a pod shelf 122 on which the pod 110 is placed and a cap attaching/detaching mechanism 123. The cap attaching/detaching mechanism 123 attaches a cap of the pod 110 used as a sealing member to the pod 110 or detaches the cap from the pod 110. The pod opener 121 may open or close a wafer entrance of the pod 110 by detaching the cap of the pod 110 placed on the pod shelf 122 from the pod 110 or attaching the cap of the pod 110 to the pod 110 using the cap attaching/detaching mechanism 123. Similar to the substrate container shelves 117, the pod shelf 122 of the pod opener 121 includes a notch (not shown) through which the front end portion of the pod transfer unit 118B may pass. The pods 110 may be exchanged between the pod opener 121 and the transfer robot 118 by moving the pod transfer unit 118B vertically with respect to the pod opener 121 [the pod shelf 122].

A transfer chamber 124 is configured by the sub housing 119, and is fluidically isolated from a space in which the transfer robot 118 or the pod shelf 105 is installed. A wafer transfer mechanism 125 is installed in the transfer chamber 124. The wafer transfer mechanism 125 includes a wafer transfer device 125A which rotationally or linearly moves the wafers 200 in the horizontal direction, a wafer transfer device elevator 125B (see FIG. 1) which moves the wafer transfer device 125A upward or downward and a plurality of tweezers 125C on which the wafers 200 are placed. The wafer transfer mechanism 125 transfers the wafer 200 between the pod 110 placed on the pod shelf 122 and a boat 217. The boat 217 is a retainer configured to retain a plurality of wafers 200.

A process furnace 202 serving as a process chamber is installed on the transfer chamber 124. A bottom end portion of the process furnace 202 is opened or closed by a furnace port shutter 147 (see FIG. 2).

The boat 217 is moved upward or downward between the transfer chamber 124 and the process furnace 202 by a boat elevator 115 (see FIG. 1). A seal cap 219 is installed on an arm 128 (see FIG. 2) connected to the boat elevator 115. The seal cap 219 may vertically support the boat 217 and block the bottom end portion of the process furnace 202.

Next, an operation of the substrate processing apparatus 100 will be described. In the following description, various elements of the substrate processing apparatus 100 are controlled by a controller 240 which is a control unit. FIG.

4 is a block diagram of the substrate processing apparatus 100. The controller 240 is embodied as a computer including a central processing unit (CPU) and a memory unit such as a random access memory (RAM). The controller 240 controls various elements of the substrate processing apparatus 100, such as the transfer robot 118, the pod shelf 105, the wafer transfer mechanism 125 and the boat elevator 115, via an input/output (I/O) device 241.

The controller 240 may be embodied as a dedicated computer or a general-purpose computer. For example, the controller 240 may be configured by providing an external memory device 242 storing a program for controlling the above elements [e.g., a magnetic disk such as a magnetic tape, a flexible disk or a hard disk, an optical disc such as a compact disc (CD) or a digital versatile disc (DVD), a magneto-optical (MO) disc or a semiconductor memory such as a universal serial bus (USB) memory (USB flash drive) or a memory card] and then installing the program in a general-purpose computer using the external memory device 242.

A method of supplying the program to the controller 240 is not limited to using the external memory device 242. For example, the program may be directly supplied to the controller 240 through a communication means such as the Internet or an exclusive line without using the external memory device 242. The memory unit or the external memory device 242 included in the controller 240 is a non-transitory computer-readable recording medium.

Next, a method of forming a thin film on the wafer 200 using the substrate processing apparatus 100 described above, which is one of processes of manufacturing a semiconductor device, will be described. In the following description, various elements of the substrate processing apparatus 100 are controlled by the controller 240. As illustrated in FIGS. 1 and 2, when the pod 110 is placed on the loading pod shelf 114, the pod loading/unloading port 112 is opened by the front shutter 113, and the pod 110 placed on the loading pod shelf 114 is loaded into the housing 111 via the pod loading/unloading port 112 by the transfer robot 118.

Similar to the substrate container shelves 117, a notch (not shown) through which the front end portion of the pod transfer unit 118B may pass is installed on a surface of the loading pod shelf 114 on which the pod 110 is placed. By vertically moving the pod transfer unit 118B with respect to the loading pod shelf 114, the transfer robot 118 may place the pod 110 on the loading pod shelf 114 or lift the pod 110 from the loading pod shelf 114.

The pod 110 is automatically transferred to a designated substrate container shelf 117 of the pod shelf 105 by the transfer robot 118, temporarily kept on the designated substrate container shelf 117, and then transferred from the pod shelf 105 to the pod opener 121 by the transfer robot 118. In this case, the wafer loading/unloading ports 120 are closed by the cap attaching/detaching mechanism 123. A concentration of oxygen in the transfer chamber 124 is reduced to be lower than that of oxygen in the other regions of the housing 111 by filling the transfer chamber 124 with clean air such as nitrogen gas.

When an opening of the pod 110 transferred to the pod opener 121 is pressed onto openings of the wafer loading/unloading ports 120 on the front wall 119A of the sub housing 119 and the cap thereof is removed by the cap attaching/detaching mechanism 123, the inside of the pod 110 communicates with the transfer chamber 124. When the cap of the pod 110 is removed, the wafer 200 accommodated in the pod 110 is picked upward by the tweezers 125C of the wafer transfer device 125A and is charged in the boat 217.

When a predetermined number of wafers 200 are charged in the boat 217, the furnace port shutter 147 is opened to open the lower end portion of the process furnace 202. Subsequently, the boat 217 accommodating the predetermined number of wafers 200 is moved upward with the seal cap 219 by the boat elevator 115 to be loaded in the process furnace 202.

After the boat 217 is loaded, a thin film is formed on the wafers 200 in the process furnace 202 by performing a film forming process on the wafers 200. After the film forming process is completed, the wafers 200 and the pods 110 are unloaded from the substrate processing apparatus 100 in an order opposite to that described above.

Next, operations of the transfer robot 118 and the driving units 116A of the substrate processing apparatus 100 according to the present embodiment will be described. First, an example in which the pods 110 placed on the substrate container shelves 117 of the pod shelf 105 are transferred to the pod opener 121 will be described in detail below.

Figure 5:
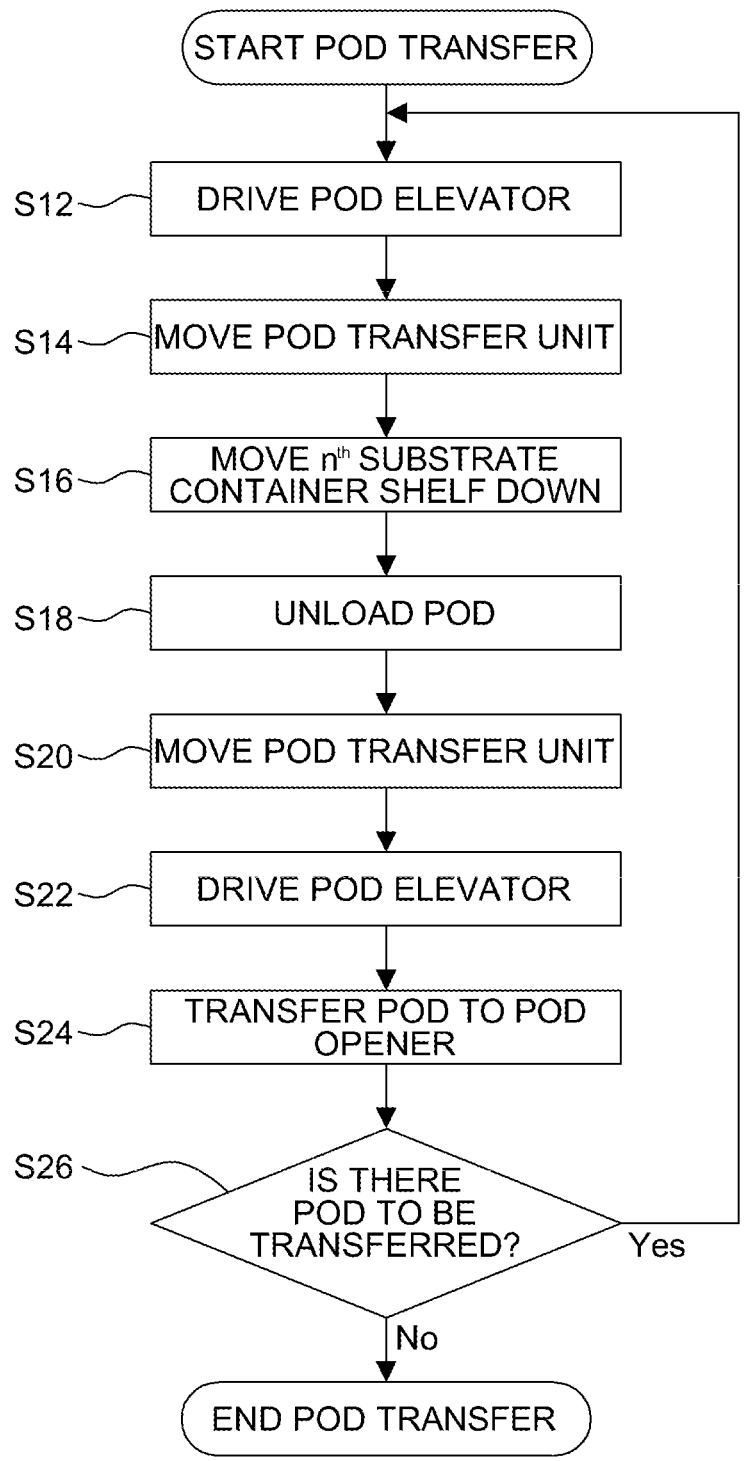
FIG. 5 is a flowchart illustrating an operation of the substrate processing apparatus according to the first embodiment described herein.
Figure 6:
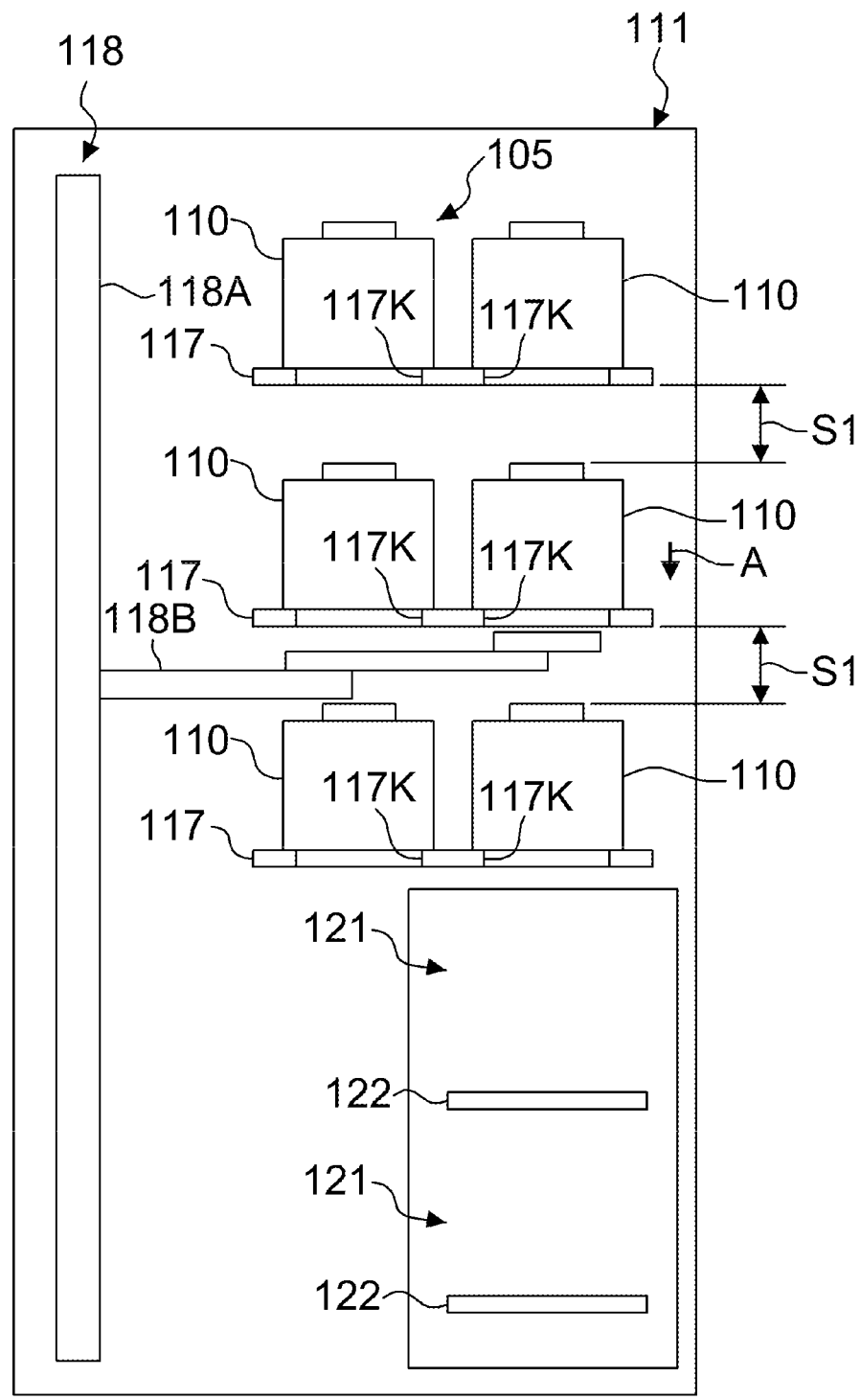
FIG. 6 is a diagram exemplifying an operation of the substrate processing apparatus according to the first embodiment described herein.
Figure 7:
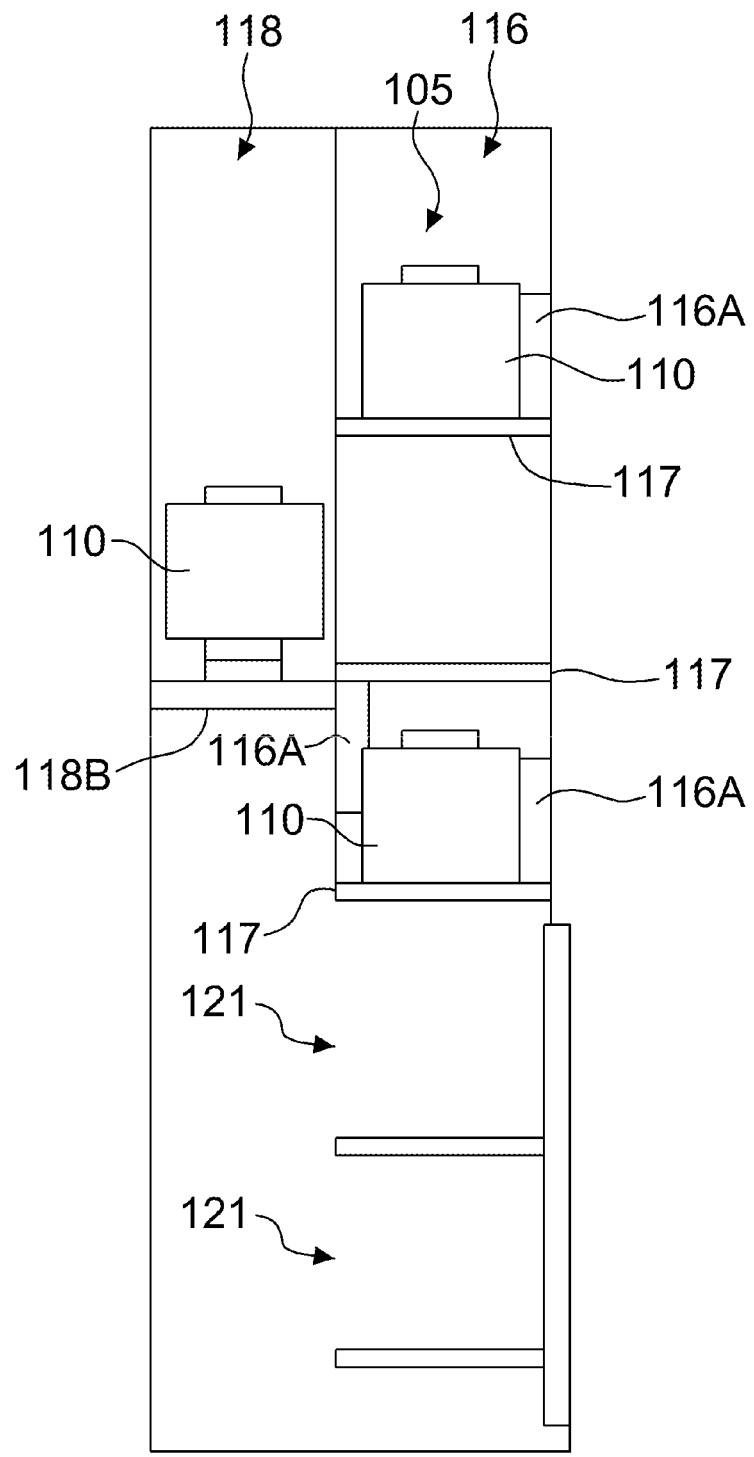
FIG. 7 is a diagram exemplifying an operation of the substrate processing apparatus according to the first embodiment described herein.

FIG. 5 is a flowchart illustrating a method of controlling transfer of the pods 110 performed by the controller 240. In detail, FIG. 5 is a flowchart exemplifying a method of unloading the pod 110 from any arbitrary one of the substrate container shelves 117 (hereinafter referred to as an "$n^{th}$ substrate container shelf 117," here n denotes an arbitrary natural number). The method according to the flowchart of FIG. 5 is performed by running a program recorded on RAM which is a recording medium installed in the controller 240. FIG. 6 is a front view of the pod shelf 105. FIG. 7 is a side view of the pod shelf 105.

In step S12, the pod elevator 118A is driven to move the front end portion of the pod transfer unit 118B [a surface of the pod transfer unit 118B on which the pod 110 is placed] to a location immediately under the $n^{th}$ substrate container shelf 117. In the first embodiment, a space between the pod 110 on the $n^{th}$ substrate container shelf 117 and the pod 110 on an $(n-1)^{th}$ substrate container shelf 117 right under the $n^{th}$ substrate container shelf 117 has a height S1 such that the front end portion of the pod transfer unit 118B (including one or more arm links connected to the front end portion) is insertable into the space. The height S1 is set based on a height of the pod transfer unit 118B inserted below the substrate container shelf 117 [including a height of a position determination pin for the pod 110 when the pin is vertically installed on the front end portion of the pod transfer unit 118B] when the pod 110 is placed thereon or lifted therefrom. Furthermore, the height S1 is greater than or equal to at least a thickness of the substrate container shelf 117 [including the height of the position determination pin for the pod 110 when the pin is installed on the substrate container shelf 117].

Next, in step S14, the pod transfer unit 118B is inserted into the space under the $n^{th}$ substrate container shelf 117 [under the pod 110 to be transferred] by driving the pod transfer unit 118B (by moving the pod transfer unit 118B in the horizontal direction) as illustrated in FIG. 6.

Next, in step S16, the driving unit 116A of the pod shelf 105 is controlled to move the $n^{th}$ substrate container shelf 117 on which the pod 110 to be unloaded is placed downward in a direction indicated by arrow A in FIG. 6 so as to place the pod 110 on the pod transfer unit 118B. The front end portion of the pod transfer unit 118B on which the pod 110 is placed passes through the notch 117K of the substrate container shelf 117 and thus the substrate container shelf 117 and the pod transfer unit 118B do not interfere with each other. The substrate container shelf 117 is moved downward by at least a distance which is greater than or equal to the thickness of the substrate container shelf 117 [including the height of the position determination pin for the pod 110 when the pin is installed on the substrate container shelf 117] or which the height S1 or less.

Next, in step S18, as illustrated in FIG. 7, the pod transfer unit 118B is horizontally moved to unload the pod 110 from the $n^{th}$ substrate container shelf 117. The pod 110 foremost among the pods 110 placed on the substrate container shelves 117 is illustrated in FIG. 7.

Next, in step S20, the pod transfer unit 118B is moved in the horizontal direction to a position corresponding to an outer side of a vertically projected plane of the substrate container shelf 117 or the pod opener 121.

Next, in step S22, the pod elevator 118A moves the pod transfer unit 118B vertically to a position corresponding to the pod opener 121 [a position immediately above the pod shelf 122].

Next, in step S24, the pod transfer unit 118B is horizontally moved to be above the pod shelf 122 of the pod opener 121 and is then moved to be below the pod shelf 122 by the pod elevator 118A, thereby transferring the pod 110 to the pod opener 121.

Next, in step S26, the method returns to step S10 when the pod 110 to be transferred is on the pod shelf 105, and the transfer of the pods 110 is ended when there is no pod 110 to be transferred is on the pod shelf 105.

As described above, in the present embodiment, the pod transfer unit 118B of the transfer robot 118 is horizontally moved to the space below the $n^{th}$ substrate container shelf 117 such that the front end portion of the pod transfer unit 118B faces the notch 117K of the substrate container shelf 117. Then the substrate container shelves 117 is moved downward in the direction indicated by the arrow A in FIG. 6 to transfer the pod 110 from the substrate container shelf 117 to the pod transfer unit 118B so that the front end portion of the pod transfer unit 118B may pass through the notch 117K of the substrate container shelves 117. Since a space into which the pod transfer unit 118B is inserted and a space defined by the notch 117K when the substrate container shelf 117 is moved overlap with each other, a space needed to transfer the pod 110 may be decreased. Conversely, in the related art, the pod 110 is transferred by positioning the pod transfer unit 118B to be below the substrate container shelf 117 and moving the pod transfer unit 118B to be above the substrate container shelf 117. According to the first embodiment, a space needed to move the pod transfer unit 118B to be above the substrate container shelf 117 is smaller than that in the related art. That is, according to the first embodiment, a space needed to transfer the pod 110 [including spaces above and below the substrate container shelf 117] may be decreased. Thus, the number of the substrate container shelves 117 to be installed in the substrate processing apparatus 100 [i.e., the number of the pods 110 to be accommodated in the substrate processing apparatus 100] may be increased.

Although an embodiment in which the pod 110 is transferred from the pod shelf 105 has been described above in detail, the substrate container shelf 117 may be moved upward or downward even when the pod 110 is transferred to the pod shelf 105.

That is, when the pod 110 is placed on the substrate container shelf 117 of the pod shelf 105, the pod transfer unit 118B of the transfer robot 118 loaded with the pod 110 is moved horizontally to a space below the substrate container shelf 117 such that the front end portion of the pod transfer unit 118B faces the notch 117K of the substrate container shelf 117. Then the substrate container shelf 117 is moved upward such that the front end portion of the pod transfer unit 118B passes through the notch 117K of the substrate container shelves 117, thereby transferring the pod 110 from the pod transfer unit 118B to the substrate container shelves 117.

When unloading the pods 110 from the plurality of the substrate container shelves 117, the controller 240 is configured to control the driving unit 116A and the transfer robot 118 such that the pods 110 are sequentially unloaded from the substrate container shelves 117 starting from the lowermost substrate container shelf 117. When the pods 110 are unloaded from the substrate container shelves 117, the substrate container shelves 117 are moved downward. Thus, when the pods 110 are sequentially unloaded from the substrate container shelves 117 starting from the lowermost substrate container shelf 117, the substrate container shelves 117 without the pods 110 need not be moved upward to their original positions, and thus an unloading operation may be efficiently performed.

When placing the pods 110 on the plurality of substrate container shelves 117, the controller 240 is configured to control the driving unit 116A and the transfer robot 118 such that the pods 110 are sequentially placed on the substrate container shelves 117 starting from the uppermost substrate container shelf 117. When the pods 110 are placed on the substrate container shelves 117, the substrate container shelves 117 are moved upward. Thus, when the pods 110 are sequentially placed on the substrate container shelves 117 starting from the uppermost substrate container shelf 117, the substrate container shelves 117 without the pods 110 need not be moved downward to their original positions, and thus a placing operation may be efficiently performed.

Second Embodiment

Next, operations of a transfer robot 118 and a plurality of driving units 116A of a pod shelf 105 of a substrate processing apparatus 100 according to a second embodiment will be described with reference to FIGS. 8 through 10 below. Elements of the second embodiment that are the same as those of the first embodiment illustrated in FIGS. 1 through 3 are assigned the same reference numerals and will not be described in detail here.

Figure 8:
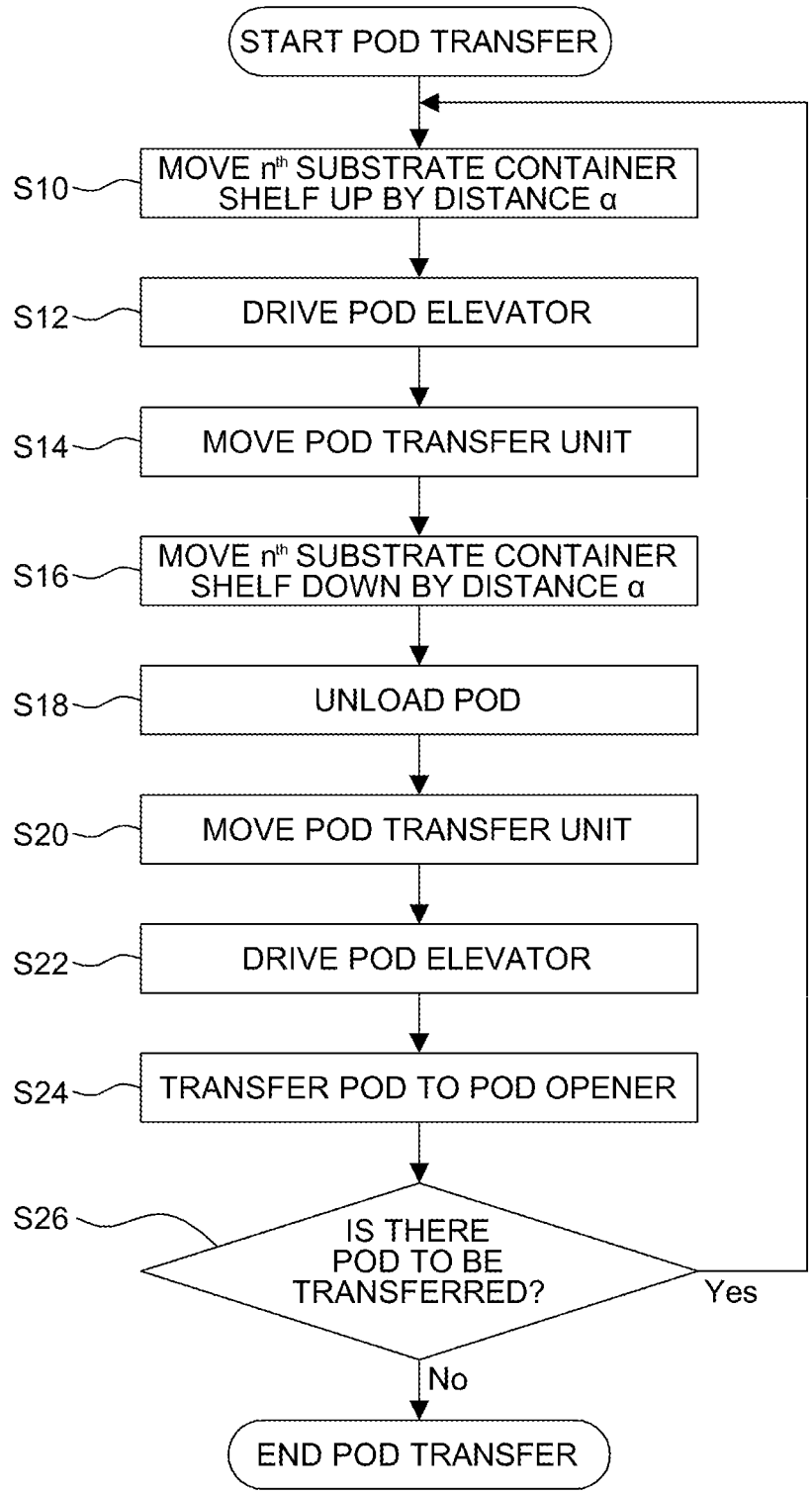
FIG. 8 is a flowchart illustrating an operation of a substrate processing apparatus according to a second embodiment described herein.

FIG. 8 is a flowchart illustrating an operation of unloading the pods 110 performed by the controller 240. FIGS. 9 through 11 are front views of the pod shelf 105.

Figure 9:
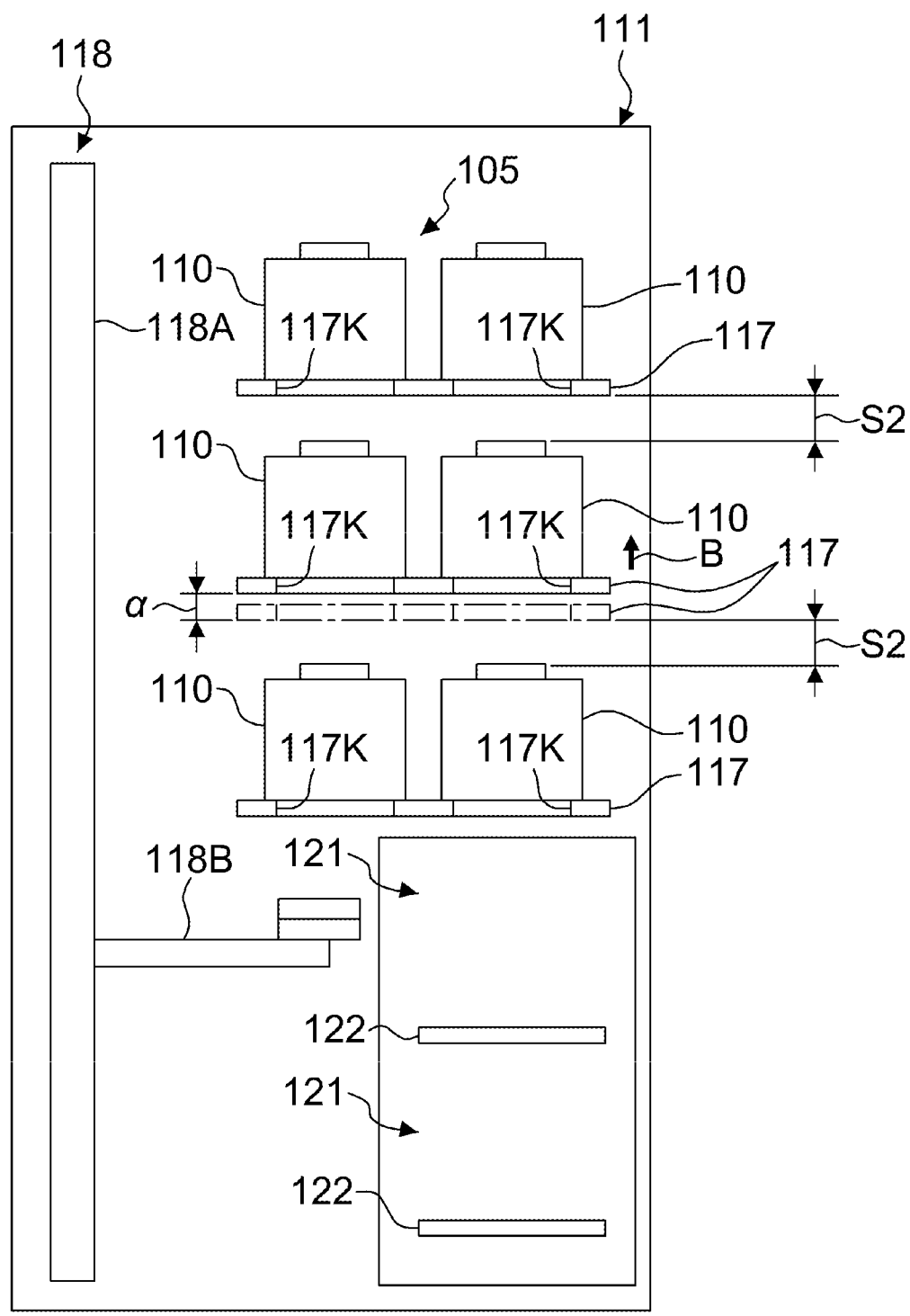
FIG. 9 is a diagram exemplifying an operation of the substrate processing apparatus according to the second embodiment described herein.

First, in step S10, the driving unit 116A of the pod shelf 105 is controlled to move the $n^{th}$ substrate container shelf 117 on which the pod 110 to be unloaded is placed upward by a distance α in a direction indicated by arrow B in FIG. 9. In the second embodiment, a space between the pod 110 on the $n^{th}$ substrate container shelf 117 and the pod 110 on the $(n-1)^{th}$ substrate container shelf 117 immediately below the $n^{th}$ substrate container shelf 117 has a height S2. For example, when the height S2 is half the height S1 into which the front end portion of the pod transfer unit 118B is insertable, the $n^{th}$ substrate container shelf 117 may be moved upward by the height S2 [=the distance α] such that the space between the pod 110 on the $n^{th}$ substrate container shelf 117 and the pod 110 on the $(n-1)^{th}$ substrate container shelf 117 has the height S1 as in the first embodiment.

Next, in step S12, the pod elevator 118A is driven to move the pod transfer unit 118B such that the front end portion of the pod transfer unit 118B [a surface of the pod transfer unit 118B on which the pod 110 is placed] is moved to a location immediately under the n$^{th}$ substrate container shelf 117.

Figure 10:
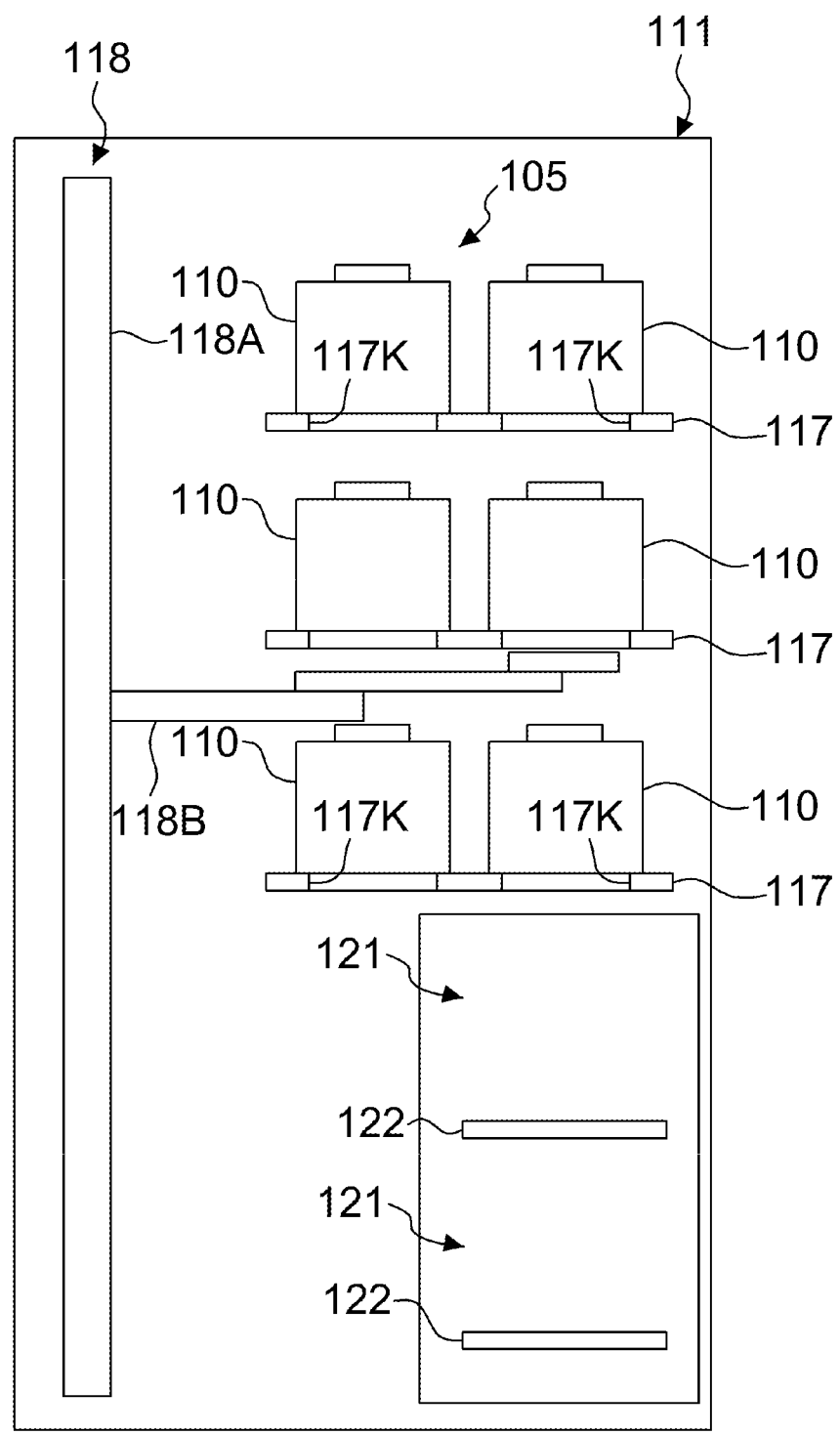
FIG. 10 is a diagram exemplifying an operation of the substrate processing apparatus according to the second embodiment described herein.
Figure 11:
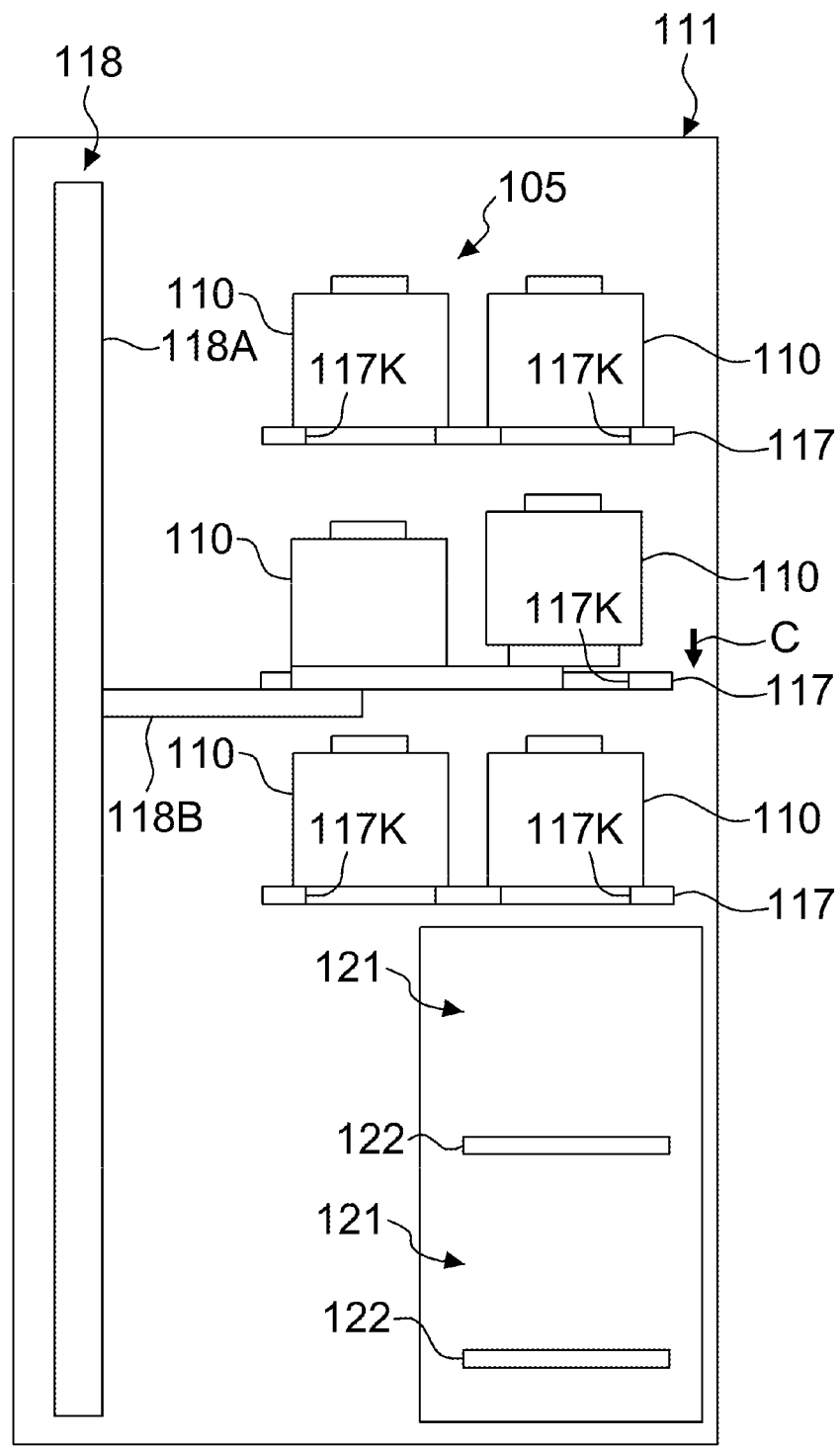
FIG. 11 is a diagram exemplifying an operation of the substrate processing apparatus according to the second embodiment described herein.

Next, in step S14, as illustrated in FIG. 10, the pod transfer unit 118B is driven (moved in the horizontal direction) to insert the pod transfer unit 118B into the space under the n$^{th}$ substrate container shelf 117 [under the pod 110 to be transferred].

Next, in step S16, the driving unit 116A of the pod shelf 105 is controlled to move the n$^{th}$ substrate container shelf 117 on which the pod 110 to be unloaded is placed downward in the direction indicated by arrow C in FIG. 11, thereby placing the pod 110 on the pod transfer unit 118B. The n$^{th}$ substrate container shelf 117 is moved downward by at least a distance which is greater than or equal to its thickness [including a height of a position determination pin for the pod 110 when the pin is installed on the n$^{th}$ substrate container shelf 117] or which is the height S1 or less. For example, when the distance α is greater than or equal to the thickness of the n$^{th}$ substrate container shelf 117 [including the height of the position determination pin for the pod 110 when the pin is installed on the n$^{th}$ substrate container shelf 117], the n$^{th}$ substrate container shelf 117 may be moved downward by the distance α.

Next, in step S18, the pod 110 is unloaded from the n$^{th}$ substrate container shelf 117 by horizontally moving the pod transfer unit 118B.

Next, in step S20, the pod transfer unit 118B is moved in the horizontal direction to a position corresponding to an outer side of a vertical projected plane of the n$^{th}$ substrate container shelf 117 or the pod opener 121.

Next, in step S22, the pod elevator 118A moves the pod transfer unit 118B in the vertical direction to a position corresponding to the pod opener 121 [a position immediately above the pod shelf 122].

Next, in step S24, the pod transfer unit 118B is horizontally moved to be above the pod shelf 122 of the pod opener 121. In this case, the substrate container shelves 117 above the pod opener 121 may be moved upward to secure a space between the pod opener 121 and the substrate container shelves 117 above the pod opener 121. Then, the pod elevator 118A moves the pod transfer unit 118B to be below the pod shelf 122 to place the pod 110 on the pod opener 121.

In step S26, the method returns to step S10 when the pod 110 to be transferred is on the pod shelf 105, and the transfer of the pod 110 is ended when there is no pod 110 to be transferred on the pod shelf 105.

In the second embodiment, when the height S2 is half the height S1 in the first embodiment, the height S1 of a space needed to transfer the pod 110 is secured by moving the n$^{th}$ substrate container shelves 117 on which the pod 110 to be unloaded is placed upward by the distance α [=the height S2] or moving the (n−1)$^{th}$ substrate container shelf immediately under the n$^{th}$ substrate container shelf on which the pod 110 to be unloaded is placed downward by the distance α. According to the second embodiment, distances between the substrate container shelves 117 may be set to be small and the number of the substrate container shelves 117 to be installed in the substrate processing apparatus 100 [i.e., the number of the substrate container shelves 117 to be accommodated in the substrate processing apparatus 100] may be large in comparison to the first embodiment.

Although an embodiment in which the pods 110 are unloaded from the pod shelf 105 has been described in detail above, the substrate container shelves 117 may be moved upward or downward even when the pods 110 are transferred to the pod shelf 105.

That is, when the pod 110 is placed on the n$^{th}$ substrate container shelf 117 of the pod shelf 105, the n$^{th}$ substrate container shelf 117 is moved downward by the distance α, and the pod transfer unit 118B of the transfer robot 118 on which the pod 110 is stacked is horizontally moved to a space above the n$^{th}$ substrate container shelf 117 caused by moving the n$^{th}$ substrate container shelf 117 downward by the distance α, so that the front end portion of the pod transfer unit 118B may face the notch 117K of the n$^{th}$ substrate container shelves 117. In this case, a surface of the pod transfer unit 118B on which the pod 110 is placed is located immediately under the n$^{th}$ substrate container shelf 117 on which the pod 110 is placed. Next, the pod 110 is transferred from the pod transfer unit 118B to the substrate container shelf 117 by moving the substrate container shelf 117 upward by the distance α so that the front end portion of the pod transfer unit 118B may pass through the notch 117K of the substrate container shelf 117.

Third Embodiment

Next, a substrate processing apparatus 1000 according to a third embodiment will be described with reference to FIG. 12 below. Elements of the third embodiment which are the same as those of the first embodiment or the second embodiment are assigned the same reference numerals and will not be described again here.

Figure 12:
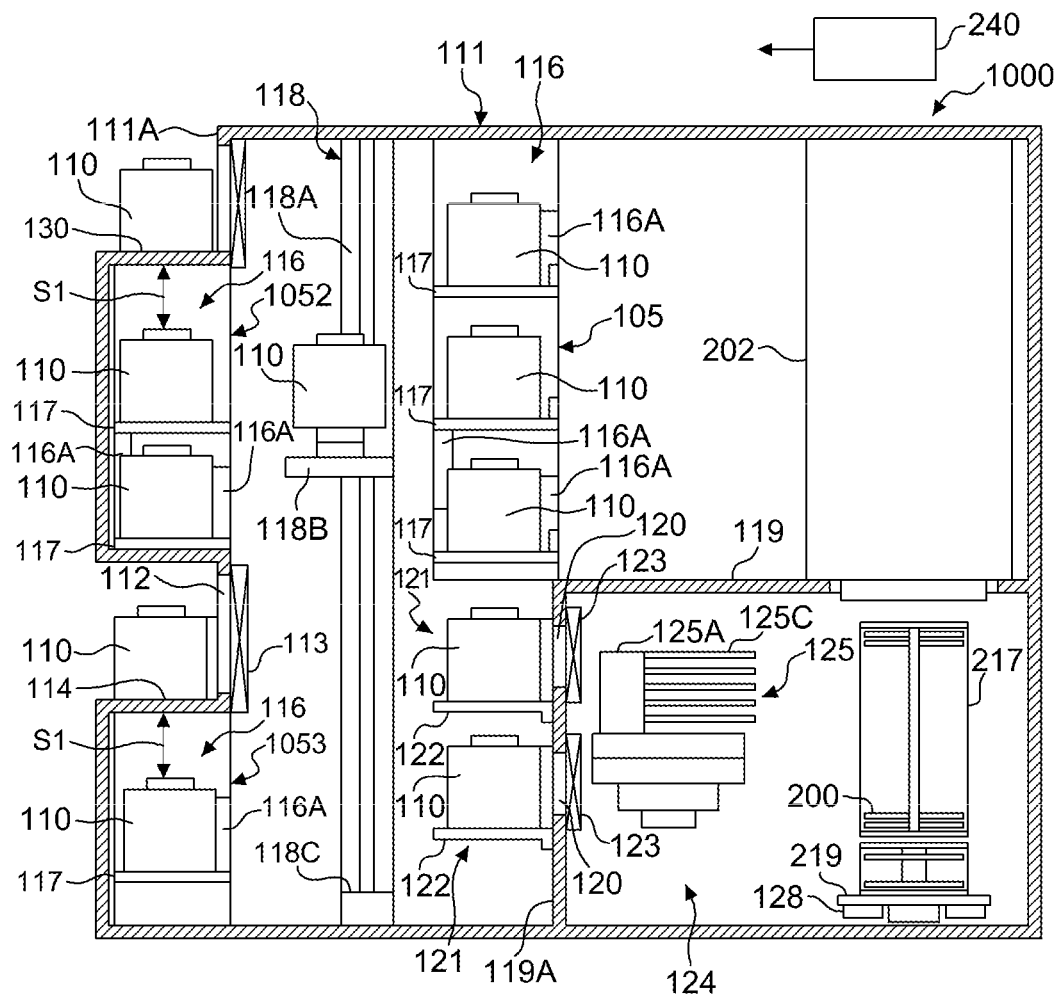
FIG. 12 is a perspective view of a side surface of a substrate processing apparatus according to a third embodiment described herein.

According to the third embodiment, as illustrated in FIG. 12, an overhead hoist transfer (OHT) stage 130 is installed above a loading pod shelf 114. The OHT stage 130 is used as a wafer loading/unloading unit, similar to the loading pod shelf 114. Similar to the loading port 114, a notch (not shown) is installed on a surface of the OHT stage 130 on which a pod 110 is placed, through which a front end portion of a pod transfer unit 118B may pass. The pods 110 may be transferred between the OHT stage 130 and a transfer robot 118 by vertically moving the pod transfer unit 118B with respect to the OHT stage 130.

A pod shelf 1052 is installed in the substrate processing apparatus 1000 in a space between the loading pod shelf 114 and the OHT stage 130. Although FIG. 12 illustrates an example in which the pod shelf 1052 includes two-tier substrate container shelves 117, the substrate container shelves 117 according to the third embodiment may be independently vertically moved, similar to the substrate container shelves 117 according to the first embodiment and the second embodiment.

A height of a space between the loading pod shelf 114 and the OHT stage 130, in which the pod shelf 1052 is installed, is S1. When the pod 110 is transferred between the OHT stage 130 and the transfer robot 118, a space having the height S1 under the OHT stage 130 is secured by moving all the two-tier substrate container shelves 117 of the pod shelf 1052 downward. Furthermore, when the pod 110 is transferred between the upper substrate container shelf 117 of the pod shelf 1052 and the transfer robot 118, a space having the height S1 between the substrate container shelves 117 is secured by moving the upper substrate container shelf 117 upward and moving the other lower substrate container shelves 117 downward. Furthermore, when the pod 110 is transferred between the lowermost substrate container shelf 117 of the pod shelf 1052 and the transfer robot 118, a space having the height S1 under the lowermost substrate container shelf 117 is secured by moving all of the two-tier substrate container shelves 117 downward. Details of an operation of transferring of the pod 110 are the same as those in the first embodiment and the second embodiment.

A pod shelf 1053 is installed in a space under the loading pod shelf 114 within the substrate processing apparatus 1000. Substrate container shelves 117 of the pod shelf 1053 may be independently vertically moved, similar to the substrate container shelves 117 described above.

A space having the height S1 is secured in a space in the loading pod shelf 114, in which the pod shelf 1053 is installed. When the pod 110 is transferred between the loading pod shelf 114 and the transfer robot 118, a space having the height S1 under the loading pod shelf 114 is secured by moving the substrate container shelves 117 of the pod shelf 1053 downward. Furthermore, when the pod 110 is transferred between the substrate container shelves 117 of the pod shelf 1053 and the transfer robot 118, the substrate container shelves 117 are moved upward to secure a space having the height S1 under the substrate container shelves 117. Details of an operation of transferring the pod 110 are the same as those in the first embodiment and the second embodiment. In FIG. 12, reference numeral 118C represents a lower limit of a space in which the pod transfer unit 118B is movable. When the pod 110 is transferred between the substrate container shelves 117 of the pod shelf 1053 and the transfer robot 118, a space having the height S1 between the lower limit of the space of the pod transfer unit 118B and the substrate container shelves 117 is secured by moving the substrate container shelves 117 upward.

According to the third embodiment, more substrate container shelves 117 may be installed using a space in the substrate processing apparatus 100. In addition, the position (or height) of the loading pod shelf 114 or the OHT stage 130 is defined according to semiconductor equipment and materials international (SEMI) standards. When a plurality of the substrate container shelves 117 are installed between the loading pod shelf 114 and the OHT stage 130 according to the SEMI standards, a sufficient space cannot be secured in a method of transferring the pods 110 according to the related art. In contrast, according to the third embodiment described herein, a space needed to transfer the pod 110 may be decreased and thus a plurality of the substrate container shelves 117 may be installed between the loading pod shelf 114 and the OHT stage 130. Similarly, when a plurality of the substrate container shelves 117 are installed in a space under the loading pod shelf 114, a sufficient space cannot be secured in the method of transferring the pods 110 according to the related art. In contrast, according to the third embodiment described herein, a space needed to transfer the pod 110 may be decreased and thus a plurality of the substrate container shelves 117 may be installed in a space under the loading pod shelf 114.

According to the third embodiment described herein, fixed substrate container shelves 117 and movable substrate container shelves 117 may coexist. Since a height of the substrate processing apparatus decreases as the number of the fixed substrate container shelves 117 decreases, the fixed substrate container shelves 117 and the movable substrate container shelves 117 are controlled to coexist according to limitations on the height of the substrate processing apparatus, thereby optimizing the specifications of the substrate processing apparatus. Furthermore, since the fixed substrate container shelves 117 do not need an elevator mechanism, the number of machine parts may decrease.

Two or more pods 110 may be placed on one substrate container shelf 117. Thus, the techniques described herein may accommodate various applications.

According to the techniques described herein, a space provided between a substrate container shelf (which is configured so that a substrate container is placed thereon) and a transfer robot (which is configured to transfer the substrate container) to transfer the substrate container may be decreased.

Exemplary Embodiments

Hereinafter, exemplary embodiments according to the techniques described herein will be supplementarily noted.

<Supplementary Note 1>

According to an aspect, there is provided a substrate processing apparatus including a first substrate container shelf where a substrate container accommodating a substrate is placed; a driving unit configured to move the first substrate container shelf vertically; a transfer robot configured to load the substrate container onto the first substrate container shelf and unload the substrate container from the first substrate container shelf; and a controller configured to control the driving unit and the transfer robot to move the first substrate container shelf downward after the transfer robot moves to under the first substrate container shelf to transfer the substrate container from the first substrate container shelf to the transfer robot.

<Supplementary Note 2>

The substrate processing apparatus of Supplementary note 1 preferably includes two or more first substrate container shelves, wherein a distance between first substrate container shelves adjacent in a vertical direction has a height S1 which is greater than or equal to a thickness of each of the two or more first substrate container shelves.

<Supplementary Note 3>

In the substrate processing apparatus of Supplementary note 2, preferably, the first substrate container shelf is moved by the height S1 or less when the first substrate container shelf is moved downward.

<Supplementary Note 4>

The substrate processing apparatus of Supplementary note 1 preferably further includes two or more first substrate container shelves, wherein a distance between first substrate container shelves adjacent in a vertical direction has a height S1 which is greater than or equal to half a thickness of each of the two or more first substrate container shelves.

<Supplementary Note 5>

In the substrate processing apparatus of Supplementary note 4, preferably, when the substrate container is unloaded from the first substrate container shelf, the controller is configured to control the driving unit and the transfer robot to transfer the substrate container from the first substrate container shelf to the transfer robot by moving the first substrate container shelf upward, moving the transfer robot to be below first substrate container shelf and moving the first substrate container shelf downward.

<Supplementary Note 6>

In the substrate processing apparatus of Supplementary note 5, preferably, the first substrate container shelf is moved by a height S2 or less when the first substrate container shelf is moved upward.

<Supplementary Note 7>

The substrate processing apparatus of Supplementary note 1 preferably further includes a pod loading/unloading port through which the substrate container is loaded into the substrate processing apparatus from the outside of the substrate processing apparatus, and an OHT stage provided above the pod loading/unloading port, wherein the first substrate container shelf is installed in a space between the pod loading/unloading port and the OHT stage.

<Supplementary Note 8>

According to another aspect, there is provided a substrate processing method or a semiconductor device manufacturing method including unloading a substrate container from a first substrate container shelf by moving a transfer robot to be below the first substrate container shelf on which the substrate container is placed, moving the first substrate container shelf downward by a driving unit which vertically drives the first substrate container shelf and transferring the substrate container from the first substrate container shelf to the transfer robot; and processing, in a process furnace, a substrate accommodated in the substrate container transferred from the transfer robot.

<Supplementary Note 9>

The method of Supplementary note 8 preferably further includes placing the substrate container in the first substrate container shelf by transferring the substrate container accommodating the substrate processed in the process furnace to the transfer robot, moving the transfer robot having the substrate container thereon to be above the first substrate container shelf, and moving the first substrate container shelf upward to transfer the substrate container from the transfer robot to the first substrate container shelf.

<Supplementary Note 10>

According to another aspect, there is provided a program causing a computer to perform a sequence of unloading a substrate container from a first substrate container shelf by moving a transfer robot to be below the first substrate container shelf on which the substrate container is placed and by transferring the substrate container from the first substrate container shelf to the transfer robot by moving the first substrate container shelf downward by a driving unit which vertically drives the first substrate container shelf; and a sequence of processing, in a process furnace, a substrate accommodated in the substrate container transferred from the transfer robot, or a non-transitory computer-readable recording medium having the program recorded thereon.

Although various embodiments have been described above, the technique described herein is not limited thereto.

As described above, the technique described herein is applicable to a substrate processing apparatus.

What is claimed is:

1. A substrate processing apparatus comprising:
a first locating part and a second locating part each configured to hold a substrate container accommodating a substrate;
a driving unit configured to drive the first locating part and the second locating part vertically;
a transfer robot configured to transfer the substrate container;
a controller configured to control the driving unit and the transfer robot to move the first locating part downward after the transfer robot moves to under the first locating part to transfer the substrate container from the locating part to the transfer robot, wherein
the first locating part and the second locating part are movable by the driving unit, and the driving unit comprises a first hydraulic cylinder mechanically connected to the first locating part and a second hydraulic cylinder mechanically connected to the second locating part, the first hydraulic cylinder being parallel to and inverted vertically from the second hydraulic cylinder.

2. The substrate processing apparatus of claim 1, wherein the controller is further configured to control the transfer robot and the driving unit to move a space under the first locating part generated by moving the first locating part upward before moving the transfer robot under the first locating part.

3. The substrate processing apparatus of claim 1, wherein the second locating part is disposed below the first locating part and is vertically movable by the driving unit, wherein the controller is further configured to control the transfer robot and the driving unit to move to a space under the first locating part generated by moving the second locating part downward.

4. The substrate processing apparatus of claim 3, wherein the controller is further configured to control the driving unit and the transfer robot to sequentially transfer the substrate container from the first or second locating parts to the transfer robot by starting from a lowermost substrate container to an uppermost substrate container.

5. The substrate processing apparatus of claim 1, wherein the first locating part comprises a notch disposed at a portion of the first locating part such that the transfer robot passes therethrough when the first locating part is moved upward with the transfer robot under the first and second locating parts.

6. A substrate processing apparatus comprising:
a first locating part and a second locating part each configured to hold a substrate container accommodating a substrate;
a driving unit configured to drive the first locating part and the second locating part vertically;
a transfer robot configured to transfer the substrate container;
a controller configured to control the driving unit and the transfer robot to move the first locating part upward after the transfer robot moves to above the first locating part to transfer the substrate container from the transfer robot to the first locating part, wherein
the first locating part and the second locating part are movable by the driving unit, and the driving unit comprises a first hydraulic cylinder mechanically connected to the first locating part and a second hydraulic cylinder mechanically connected to the second locating part, the first hydraulic cylinder being parallel to and inverted vertically from the second hydraulic cylinder.

7. The substrate processing apparatus of claim 6, wherein the controller is further configured to control the driving unit and the transfer robot to move to a space above the first locating part generated by moving the first locating part downward before moving the transfer robot above the first locating part.

8. The substrate processing apparatus of claim 6, wherein the second locating part is disposed above the first locating part and vertically movable by the driving unit, and the controller is further configured to control the transfer robot and the driving unit to move to a space above the first locating part generated by moving the second locating part upward before moving the first locating part upward.

9. The substrate processing apparatus of claim 8, wherein the controller is further configured to control the driving unit and the transfer robot to sequentially transfer the substrate container from the transfer robot to the first or second locating parts by starting from an uppermost substrate container to a lowermost substrate container.

* * * * *